United States Patent
Higby et al.

(10) Patent No.: US 10,916,273 B2
(45) Date of Patent: Feb. 9, 2021

(54) PLUGGING CALIBRATION TOOL

(71) Applicant: International Business Machines Corporation, Armonk, NY (US)

(72) Inventors: Arthur Higby, Cottekill, NY (US); Mateusz Koziol, Poughkeepsie, NY (US); Enrico A. Romano, Dutchess, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 211 days.

(21) Appl. No.: 16/244,802

(22) Filed: Jan. 10, 2019

(65) Prior Publication Data

US 2020/0227092 A1 Jul. 16, 2020

(51) Int. Cl.
*G11C 5/04* (2006.01)
*H05K 7/10* (2006.01)
*H05K 5/02* (2006.01)
*H05K 7/12* (2006.01)

(52) U.S. Cl.
CPC ............. *G11C 5/04* (2013.01); *H05K 5/0221* (2013.01); *H05K 5/0286* (2013.01); *H05K 7/10* (2013.01); *H05K 7/12* (2013.01)

(58) Field of Classification Search
CPC .... H05K 13/0448; H05K 13/089; H05K 7/10; H05K 7/12; H05K 5/0221; H05K 5/0286; Y10T 29/53261; Y10T 29/53174; Y10T 29/53183; Y10T 29/53257; Y10T 29/53913; Y10T 29/53974; Y10T 29/53983
See application file for complete search history.

(56) References Cited

U.S. PATENT DOCUMENTS

| 3,797,092 | A | | 3/1974 | Einarson |
| 4,583,287 | A | | 4/1986 | McDevitt et al. |
| 4,739,550 | A | * | 4/1988 | Schaeffer ............... B23K 3/087 29/741 |
| 4,868,975 | A | | 9/1989 | Zaremba et al. |
| 6,021,562 | A | | 2/2000 | Boster et al. |
| 6,457,251 | B1 | * | 10/2002 | Feltner ................. H05K 13/089 33/567 |

(Continued)

FOREIGN PATENT DOCUMENTS

CN 104289887 A 1/2015

*Primary Examiner* — Tyrone V Hall, Jr.
(74) *Attorney, Agent, or Firm* — Cantor Colburn LLP; Tihon Poltavets (57) ABSTRACT

A plugging calibration tool is provided. The plugging calibration tool includes a body and a slide clamp assembly. The body includes keying portions, flanges and a calibrator. The slide clamp assembly includes a slide clamp, which is movable between the keying portions and the flanges, and biasing and locking elements. The biasing and locking elements are respectively configured to bias the slide clamp toward and to lock the slide clamp in abutment with a tool head, which is fittable between the keying portions and the slide clamp, such that the tool head engages with the keying portions. A head of a screw engaged with the tool head is receivable in the calibrator and rotatable in the calibrator such that the head of the screw is drawn into abutment with a calibration surface of the calibrator while the tool head engages with the keying portions.

20 Claims, 4 Drawing Sheets

(56) References Cited

U.S. PATENT DOCUMENTS

| | | |
|---|---|---|
| 7,396,244 B1 | 7/2008 | Barna et al. |
| 7,913,379 B2 | 3/2011 | Bodenweber et al. |
| 2009/0211083 A1* | 8/2009 | Bodenweber ...... H05K 13/0447 29/737 |
| 2014/0004734 A1 | 1/2014 | Hoang |
| 2014/0170881 A1 | 6/2014 | Decesaris et al. |

* cited by examiner

FIG. 7

PLUGGING CALIBRATION TOOL

BACKGROUND

The present invention generally relates to a plugging calibration tool, and more specifically, to a plugging calibration tool for use with dual in-line memory modules (DIMMs).

A DIMM includes a series of dynamic random-access memory (DRAM) integrated circuits. DIMMs are typically mounted in groups on a printed circuit board (PCB) and designed for use in personal computers, workstations, and servers. Recently, DIMMs have begun to replace single in-line memory modules (SIMMs) as a predominant type of memory module. While the contacts on SIMMs on both sides are redundant, DIMMs have separate electrical contacts on each side. Another difference is that standard SIMMs have a 32-bit data path, while standard DIMMs have a 64-bit data path.

SUMMARY

Embodiments of the present invention are directed to a plugging calibration tool. A non-limiting example of the plugging calibration tool includes a body and a slide clamp assembly. The body includes keying portions, flanges, and a calibrator. The slide clamp assembly includes a slide clamp, which is movable between the keying portions and the flanges, and biasing and locking elements. The biasing and locking elements are respectively configured to bias the slide clamp toward and to lock the slide clamp in abutment with a tool head, which is fittable between the keying portions and the slide clamp, such that the tool head engages with the keying portions. A head of a screw engaged with the tool head is receivable in the calibrator and rotatable in the calibrator such that the head of the screw is drawn into abutment with a calibration surface of the calibrator while the tool head engages with the keying portions.

Embodiments of the present invention are directed to a plugging calibration tool for use with a tool head assembly that includes a tool head and a screw engaged with the tool head. A non-limiting example of the plugging calibration tool includes a body and a slide clamp assembly. The body includes keying portions, flanges, and a calibrator. The slide clamp assembly includes a slide clamp, which is movable between the keying portions and the flanges, and biasing and locking elements. The biasing and locking elements are respectively configured to bias the slide clamp toward and to lock the slide clamp in abutment with the tool head, which is fittable between the keying portions and the slide clamp, such that the tool head engages with the keying portions. A head of the screw is receivable in the calibrator and rotatable in the calibrator such that the head of the screw is drawn into abutment with a calibration surface of the calibrator while the tool head engages with the keying portions.

Embodiments of the present invention are directed to a plugging calibration tool. A non-limiting example of the plugging calibration tool includes a body, a slide clamp assembly, and a tool head assembly. The body includes keying portions, flanges, and a calibrator. The slide clamp assembly includes a slide clamp, which is movable between the keying portions and the flanges, and biasing and locking elements. The tool head assembly includes a tool head, which is fittable between the keying portions and the slide clamp, and a screw engaged with the tool head. The biasing and locking elements are respectively configured to bias the slide clamp toward and to lock the slide clamp in abutment with the tool head such that the tool head engages with the keying portions. The head of the screw is receivable in the calibrator and rotatable in the calibrator such that the head of the screw is drawn into abutment with a calibration surface of the calibrator while the tool head engages with the keying portions.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, with the introduction of DIMMs into computing technologies and associated fields, DIMM plugging tools have been developed and designed to facilitate the plugging of DIMMs into a PCB. The DIMM plugging tolls tended to fail in practice, however, due to certain design flaws. In particular, it has been found that the DIMM plugging tools do not fully plug DIMMs into their respective nodes and that this failure often led to further failures during testing. Often, the plugging errors arose due to a lack of calibration between the DIMM plugging tool and the DIMM and was often caused by a height of an insert head of the DIMM plugging tool not being located at a correct height for a given DIMM.

Turning now to an overview of the aspects of the invention, one or more embodiments of the invention address the above-described shortcomings of the prior art by providing a DIMM plugging calibration tool that allows an operator to check a height of a bolt on an insert/extract tool element and allows the operator to change of the height of the bolt if the height is found to not be correctly calibrated for a given DIMM. The DIMM plugging calibration tool is simple, quick and safe to use.

The above-described aspects of the invention address the shortcomings of the prior art by providing for in-tool bolt adjustment that allows a user to know when calibration occurs and to determine that a particular screw height is achieved from a surface on another part instead of the part the screw is inserted into, by providing for the possibility of two heads to be calibrated at a same time using only one tool, by providing for a tool that is keyed so that a head cannot be placed on an incorrect side and by providing for a tool that can be additively manufactured.

Figure 1:
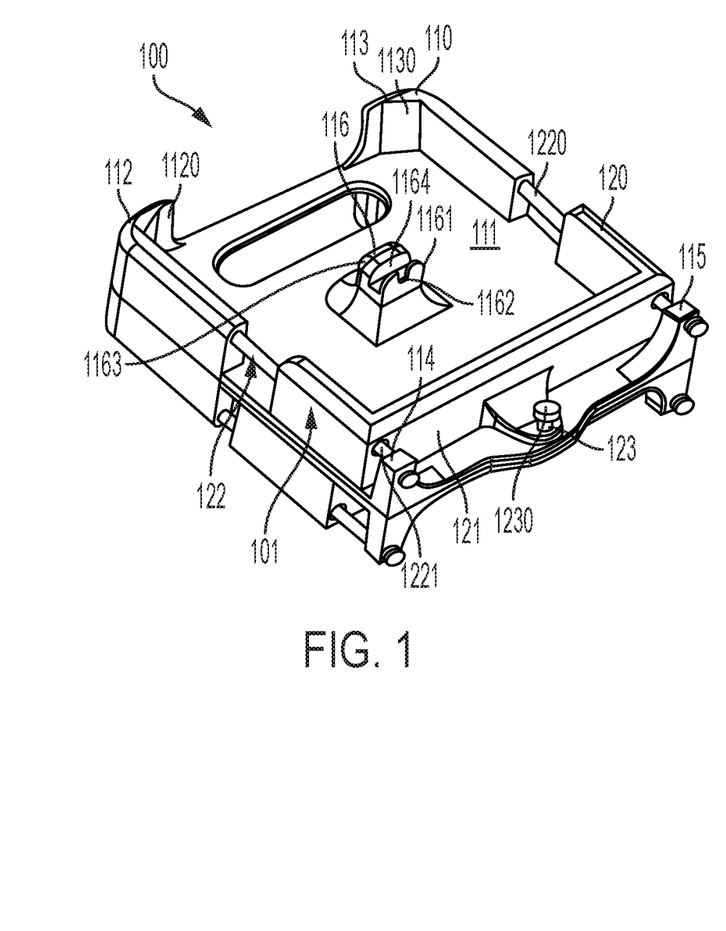
FIG. 1 is a perspective view of an insert side of a plugging calibration tool in accordance with embodiments of the present invention.
Figure 2:
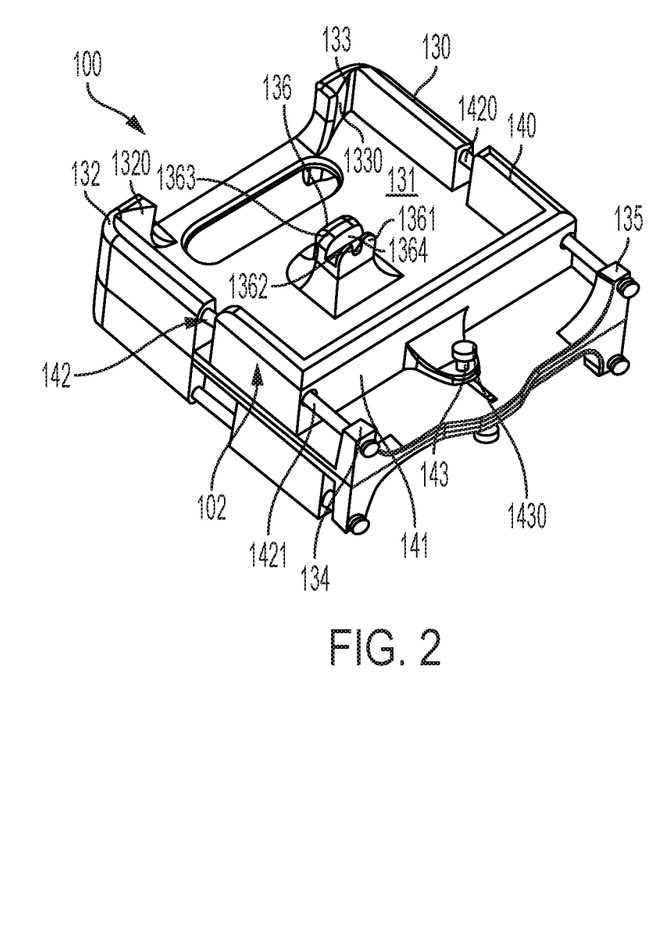
FIG. 2 is a perspective view of an extract side of the plugging calibration tool of FIG. 1 in accordance with embodiments of the present invention.

Turning now to a more detailed description of aspects of the present invention, FIG. 1 is a perspective view of an insert tool side 101 of a body 110 and a slide clamp assembly 120 of a two-sided plugging calibration tool 100 and FIG. 2 is a perspective view of an extract tool side 102 of a body 130 and a slide clamp assembly 140 of the two-sided plugging calibration tool 100. The two-sided plugging calibration tool 100 of FIGS. 1 and 2 is similar to a one-sided (i.e., insert-type or extract-type) plugging calibration tool such as the insert-type plugging calibration tool 300 of FIGS. 3-7.

As shown in FIG. 1, at the insert tool side 101 of the two-sided plugging calibration tool 100, the body 110 includes a backplane 111, first and second keying portions 112 and 113, which are supported on opposite sides of the backplane 111, first and second flanges 114 and 115, which are supported on opposite sides of the backplane 111 in respective association with the first and second keying portions 112 and 113, and a calibrator 116. The first and second keying portions 112 and 113 extend along opposite edges of the backplane 111 and around opposite forward corners of the backplane 111 to form interior facing surfaces 1120 and 1130 that are keyed for engagement with contact surfaces 1121 and 1131 of an insert head assembly 301 (see FIGS. 4-6). The first and second flanges 114 and 115 are disposed at opposite rear corners of the backplane 111. The calibrator 116 is supported in a central region of the backplane 111 and includes a first head 1161, which is formed to define an opening 1162, and a second head 1163. The second head 1163 is disposed at a distance from the first head 1161 and includes a calibration surface 1164. The calibration surface 1164 faces the opening 1162.

As further shown in FIG. 1, the slide clamp assembly 120 includes a slide clamp 121, which is fittable between the first and second keying portions 112 and 113 and the first and second flanges 114 and 115 and which is movable between the first and second keying portions 112 and 113 and the first and second flanges 114 and 115, a biasing element 122 and a locking element 123. The slide clamp 121 can include a crossbeam and edge beams extending from opposite sides of the crossbeam. The biasing element 122 includes shafts 1220 and elastic elements 1221. The shafts 1220 extend through the corresponding edge beam of the slide clamp 121 from the first flange 114 to the first keying portion 112 and through the corresponding edge beam of the slide clamp 121 from the second flange 115 to the second keying portion 113. The elastic elements 1221 are anchored on the shafts 1220 between the first and second flanges 114 and 115 and the slide clamp 121. The slide clamp 121 is movable along the shafts 1220 between the first and second keying portions 112 and 113 and the first and second flanges 114 and 115 in only a single dimension with the bias of the elastic elements 1221 directed toward the slide clamp 121 in the single dimension. The locking element 123 includes a locking pin 1230 that extends through a protrusion of the slide clamp 121 toward selective engagement with the backplane 111. As such, when it is desirable to move the slide clamp 121 toward or away from the first and second keying portions 112 and 113, the locking element 123 can be disengaged by a disengagement of the locking pin 1230 and the backplane 111. Conversely, when it is desirable to lock slide clamp 121 in a given position, the locking element 123 can be engaged by an engagement of the locking pin 1230 and the backplane 111.

As shown in FIG. 2, at the extract tool side 102 of the two-sided plugging calibration tool 100, the body 130 includes a backplane 131, first and second keying portions 132 and 133, which are supported on opposite sides of the backplane 131, first and second flanges 134 and 135, which are supported on opposite sides of the backplane 131 in respective association with the first and second keying portions 132 and 133, and a calibrator 136. The first and second keying portions 132 and 133 extend along opposite edges of the backplane 131 and around opposite forward corners of the backplane 131 to form interior facing surfaces 1320 and 1330 that are keyed for engagement with contact surfaces of an extract head assembly (not shown but similar to the insert head assembly 301 of FIGS. 4-6). The first and second flanges 134 and 135 are disposed at opposite rear corners of the backplane 131. The calibrator 136 is supported in a central region of the backplane 131 and includes a first head 1361, which is formed to define an opening 1362, and a second head 1363. The second head 1363 is disposed at a distance from the first head 1361 and includes a calibration surface 1364. The calibration surface 1364 faces the opening 1362.

As further shown in FIG. 2, the slide clamp assembly 140 includes a slide clamp 141, which is fittable between the first and second keying portions 132 and 133 and the first and second flanges 134 and 135 and which is movable between the first and second keying portions 132 and 133 and the first and second flanges 134 and 135, a biasing element 142 and a locking element 143. The slide clamp 141 can include a crossbeam and edge beams extending from opposite sides of the crossbeam. The biasing element 142 includes shafts 1420 and elastic elements 1421. The shafts 1420 extend through the corresponding edge beam of the slide clamp 141 from the first flange 134 to the first keying portion 132 and through the corresponding edge beam of the slide clamp 141 from the second flange 135 to the second keying portion 133. The elastic elements 1421 are anchored on the shafts 1420 between the first and second flanges 134 and 135 and the slide clamp 141. The slide clamp 141 is movable along the shafts 1420 between the first and second keying portions 132 and 133 and the first and second flanges 134 and 135 in only a single dimension with the bias of the elastic elements 1421 directed toward the slide clamp 141 in the single dimension. The locking element 143 includes a locking pin 1430 that extends through a protrusion of the slide clamp 141 toward selective engagement with the backplane 131. As such, when it is desirable to move the slide clamp 141 toward or away from the first and second keying portions 132 and 133, the locking element 143 can be disengaged by a disengagement of the locking pin 1430 and the backplane 131. Conversely, when it is desirable to lock slide clamp 141 in a given position, the locking element 143 can be engaged by an engagement of the locking pin 1430 and the backplane 131.

Figure 3:
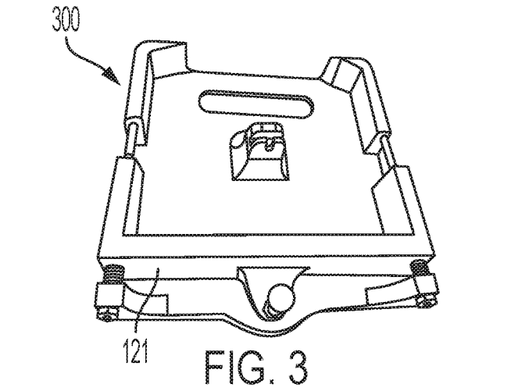
FIG. 3 is a perspective view of an initial stage of an operation of a one-sided insert-type plugging calibration tool in accordance with embodiments of the present invention.
Figure 4:
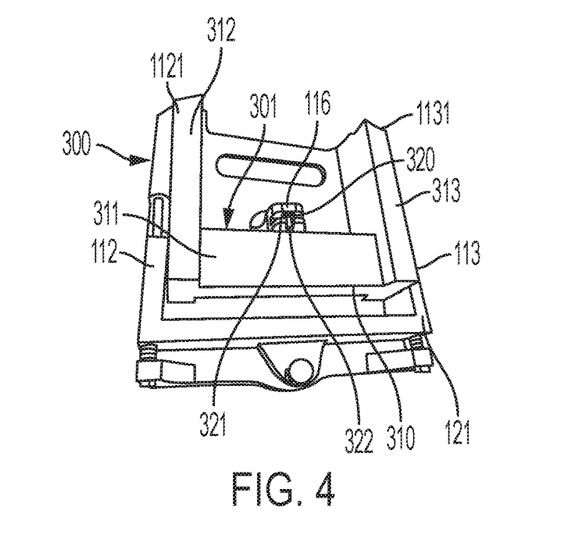
FIG. 4 is a perspective view of a secondary stage of an operation of a one-sided insert-type plugging calibration tool in accordance with embodiments of the present invention.
Figure 5:
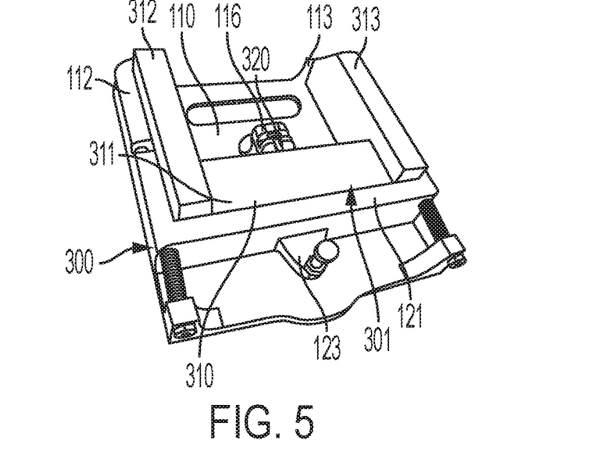
FIG. 5 is a perspective view of a tertiary stage of an operation of a one-sided insert-type plugging calibration tool in accordance with embodiments of the present invention.
Figure 6:
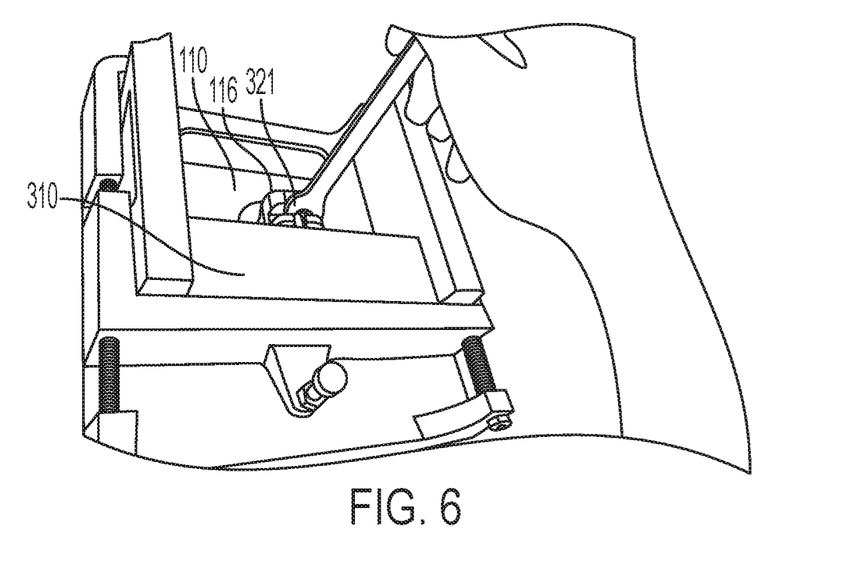
FIG. 6 is a perspective view of a quaternary stage of an operation of a one-sided insert-type plugging calibration tool in accordance with embodiments of the present invention.

With reference to FIGS. 3-7, the insert-type plugging calibration tool 300 is provided and is constructed as described above for use with a tool head assembly, such as the insert head assembly 301 of FIGS. 4-6. It is to be understood that the insert-type plugging calibration tool 300 and the insert head assembly 301 would be similar to an extract-type plugging calibration tool provided for use with a tool head assembly, such as an extract head assembly.

While the insert-type plugging calibration tool 300 is empty as shown in FIG. 3 with the slide clamp 121 provided in the most-open position, the insert head assembly 301 is inserted into the insert-type plugging calibration tool 300 as shown in FIG. 4.

The insert head assembly 301 includes an insert tool head 310 and a screw 320. The insert tool head 310 includes a crossbeam 311 and edge beams 312 and 313 that extend from opposite sides of the crossbeam 311. Distal edges of the edge beams 312 and 313 are provided as the contact surfaces 1121 and 1131. The screw 320 is threadably engaged with the crossbeam 311 and has a head 321 and a threaded shaft 322 whereby rotation of the screw 320 about a rotational axis of the threaded shaft 322 causes the threaded shaft 322 to threadably engage with the crossbeam 311 and to cause the head 321 to draw toward or recede away from the crossbeam 311.

When the insert head assembly 301 is inserted into the insert-type plugging calibration tool 300 as shown in FIG. 4, the edge beams 312 and 313 tightly fit between the first and second keying portions 112 and 113 and between the edge beams of the slide clamp 121, the crossbeam of the slide clamp 121 is not yet in contact with the crossbeam 311 and the head 321 is received in the calibrator 116 and is rotatable in the calibrator 116.

As shown in FIG. 5, the crossbeam of the slide clamp 121 is brought into contact with the crossbeam 311 following a disengagement of the locking element 123, a movement of the slide clamp 121 into abutment with the insert tool head 310, which brings the contact surfaces 1121 and 1131 (see FIG. 4) into close engagement with the interior facing surfaces 1120 and 1130 (see FIG. 1) of the first and second keying portions 112 and 113, and a re-engagement of the locking element 123, which effectively locks the insert tool head 310 into place relative to the body 110.

Figure 7:
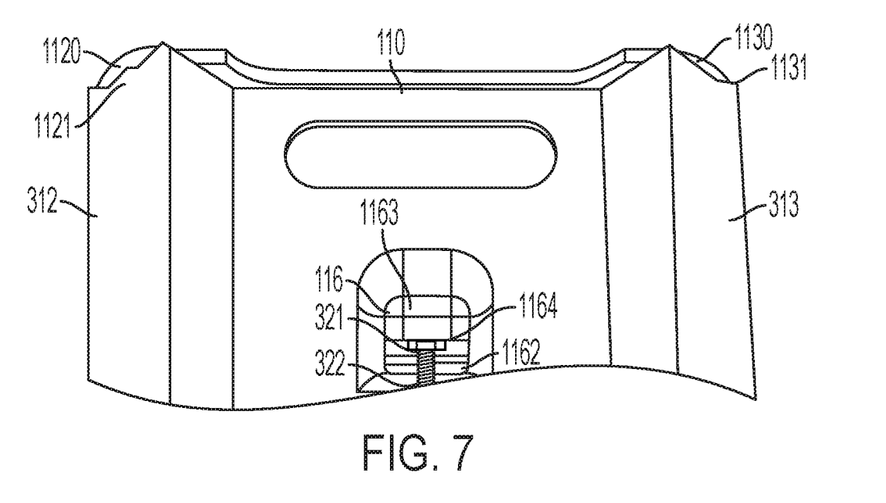
FIG. 7 is a perspective view of a late stage of an operation of a one-sided insert-type plugging calibration tool in accordance with embodiments of the present invention.

At this point, as shown in FIGS. 6 and 7, with the insert tool head 310 effectively locked into place relative to the body 110, a rotation of the head 321 within the calibrator 116 results in the head 321 being drawn away from or toward and into abutment with the calibration surface 1164 (see FIG. 7) of the calibrator 116. This results in the head 321 and the contact surfaces 1121 and 1131 being calibrated relative to each other for whichever DIMM for which the insert-type plugging calibration tool 300 is designed.

Figure 8:
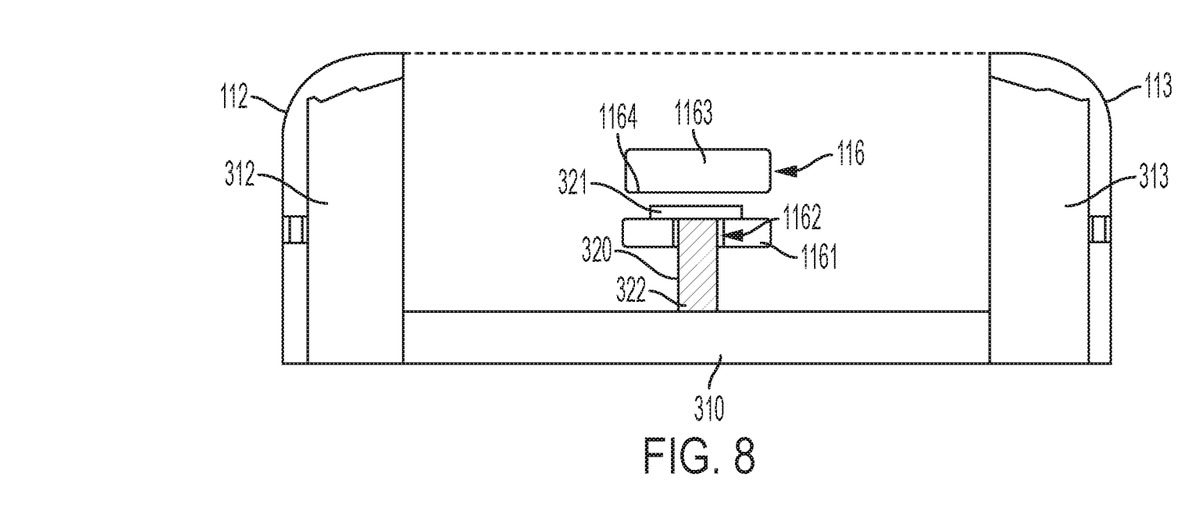
FIG. 8 is a schematic plan view of an initial stage of a calibration operation of a plugging calibration tool in accordance with embodiments of the present invention.
Figure 9:
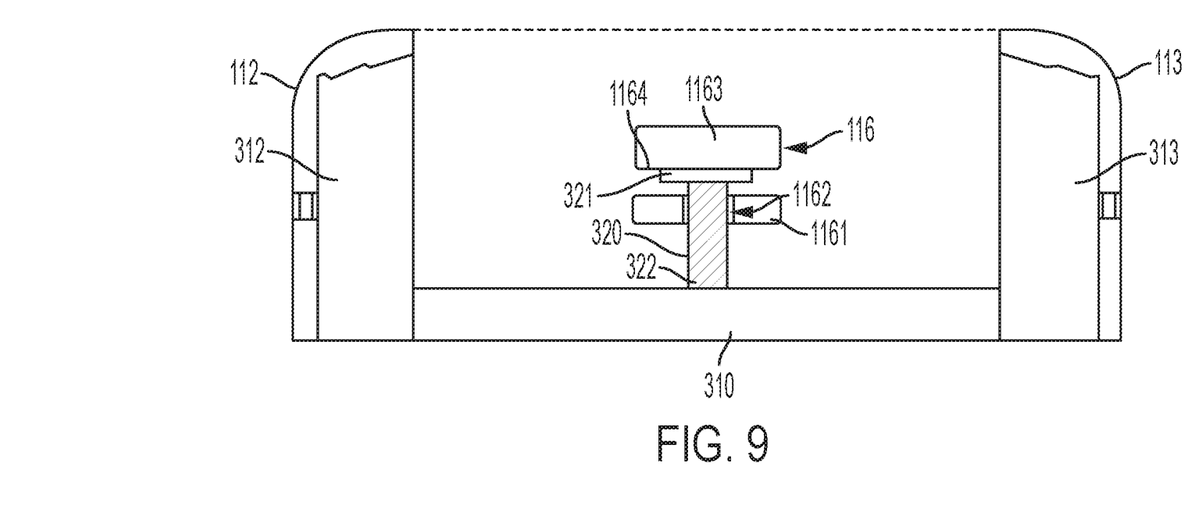
FIG. 9 is a schematic plan view of a late stage of a calibration operation of a plugging calibration tool in accordance with embodiments of the present invention.

The calibration action can be clearly seen with further reference to FIGS. 8 and 9.

As shown in FIG. 8, the contact surfaces 1121 and 1131 can be brought into tight-fitting contact with the interior facing surfaces 1120 and 1130 of the first and second keying portions 112 and 113 while the head 321 can be received in the calibrator 116 but not disposed in an abutment condition with the calibration surface 1164. In this state, the head 321 and the contact surfaces 1121 and 1131 are not calibrated relative to each other for whichever DIMM for which the insert-type plugging calibration tool 300 is designed (i.e., the insert head assembly 301 is not calibrated).

As shown in FIG. 9, the contact surfaces 1121 and 1131 remain in tight-fitting contact with the interior facing surfaces 1120 and 1130 of the first and second keying portions 112 and 113 while the head 321 is received in the calibrator 116 and the head 321 has been rotated in the calibrator 116 such that it is disposed in an abutment condition with the calibration surface 1164. In this state, the head 321 and the contact surfaces 1121 and 1131 are calibrated relative to each other for whichever DIMM for which the insert-type plugging calibration tool 300 is designed (i.e., the insert head assembly 301 is calibrated).

It is to be understood that each element described herein can be produced, formed or generated by one or more types of additive manufacturing or other similar fabrication processes. In each case, the resulting elements (e.g., the insert-type plugging calibration tool 300) can be designed for use with specific and particular DIMMs so as to avoid the problem of incomplete insertion/extraction that is currently observed.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A plugging calibration tool, comprising:
   a body comprising keying portions, flanges and a calibrator; and
   a slide clamp assembly comprising a slide clamp, which is movable between the keying portions and the flanges, and biasing and locking elements,
   the biasing and locking elements being respectively configured to bias the slide clamp toward and to lock the slide clamp in abutment with a tool head, which is fittable between the keying portions and the slide clamp, such that the tool head engages with the keying portions, and
   a head of a screw engaged with the tool head being receivable in the calibrator and rotatable in the calibrator such that the head of the screw is drawn into abutment with a calibration surface of the calibrator while the tool head engages with the keying portions.

2. The plugging calibration tool according to claim 1, wherein the keying portions engage with contact surfaces of an insert-type or an extract-type tool head.

3. The plugging calibration tool according to claim 1, wherein the calibrator comprises:
   a first head defining an opening through which a shaft of the screw is extendable; and
   a second head comprising the calibration surface, the second head being disposed at a distance from the first head such that the calibration surface faces the opening.

4. The plugging calibration tool according to claim 1, wherein the slide clamp is movable in a single dimension.

5. The plugging calibration tool according to claim 1, wherein the locking element comprises a locking pin extending through the slide clamp to engage with the body.

6. The plugging calibration tool according to claim 1, wherein the body is a two-sided body and the slide clamp assembly comprises:
   slide clamps, which are respectively movable between the keying portions and the flanges of one of the sides of the two-sided body; and
   biasing and locking elements for each one of the sides of the two-sided body.

7. The plugging calibration tool according to claim 6, wherein:
   the keying portions of one of the sides of the two-sided body engage with contact surfaces of an insert-type tool head, and
   the keying portions of another one of the sides of the two-sided body engage with contact surfaces of an extract-type tool head.

8. A plugging calibration tool for use with a tool head assembly comprising a tool head and a screw engaged with the tool head, the plugging calibration tool comprising:
   a body comprising keying portions, flanges and a calibrator; and
   a slide clamp assembly comprising a slide clamp, which is movable between the keying portions and the flanges, and biasing and locking elements,
   the biasing and locking elements being respectively configured to bias the slide clamp toward and to lock the slide clamp in abutment with the tool head, which is fittable between the keying portions and the slide clamp, such that the tool head engages with the keying portions, and
   a head of the screw being receivable in the calibrator and rotatable in the calibrator such that the head of the screw is drawn into abutment with a calibration surface of the calibrator while the tool head engages with the keying portions.

9. The plugging calibration tool according to claim 8, wherein the keying portions engage with contact surfaces of an insert-type or an extract-type tool head.

10. The plugging calibration tool according to claim 8, wherein the calibrator comprises:
    a first head defining an opening through which a shaft of the screw is extendable; and
    a second head comprising the calibration surface, the second head being disposed at a distance from the first head such that the calibration surface faces the opening.

11. The plugging calibration tool according to claim 8, wherein the slide clamp is movable in a single dimension.

12. The plugging calibration tool according to claim 8, wherein the locking element comprises a locking pin extending through the slide clamp to engage with the body.

13. The plugging calibration tool according to claim 8, wherein the body is a two-sided body and the slide clamp assembly comprises:
    slide clamps, which are respectively movable between the keying portions and the flanges of one of the sides of the two-sided body; and
    biasing and locking elements for each one of the sides of the two-sided body.

14. The plugging calibration tool according to claim 13, wherein:
    the keying portions of one of the sides of the two-sided body engage with contact surfaces of an insert-type tool head, and
    the keying portions of another one of the sides of the two-sided body engage with contact surfaces of an extract-type tool head.

15. A plugging calibration tool, comprising:
    a body comprising keying portions, flanges and a calibrator;
    a slide clamp assembly comprising a slide clamp, which is movable between the keying portions and the flanges, and biasing and locking elements; and
    a tool head assembly comprising a tool head, which is fittable between the keying portions and the slide clamp, and a screw engaged with the tool head, the biasing and locking elements being respectively configured to bias the slide clamp toward and to lock the slide clamp in abutment with the tool head such that the tool head engages with the keying portions, and a head of the screw being receivable in the calibrator and rotatable in the calibrator such that the head of the screw is drawn into abutment with a calibration surface of the calibrator while the tool head engages with the keying portions.

16. The plugging calibration tool according to claim 15, wherein the keying portions engage with contact surfaces of an insert-type or an extract-type tool head.

17. The plugging calibration tool according to claim 15, wherein the calibrator comprises:
   a first head defining an opening through which a shaft of the screw is extendable; and
   a second head comprising the calibration surface, the second head being disposed at a distance from the first head such that the calibration surface faces the opening.

18. The plugging calibration tool according to claim 15, wherein the slide clamp is movable in a single dimension.

19. The plugging calibration tool according to claim 15, wherein the locking element comprises a locking pin extending through the slide clamp to engage with the body.

20. The plugging calibration tool according to claim 15, wherein:
   the body is a two-sided body and the slide clamp assembly comprises slide clamps, which are respectively movable between the keying portions and the flanges of one of the sides of the two-sided body, and biasing and locking elements for each one of the sides of the two-sided body, and
   the keying portions of one of the sides of the two-sided body engage with contact surfaces of an insert-type tool head and the keying portions of another one of the sides of the two-sided body engage with contact surfaces of an extract-type tool head.

* * * * *